(12) United States Patent
Mortenson

(10) Patent No.: US 7,161,083 B2
(45) Date of Patent: Jan. 9, 2007

(54) HIGH EFFICIENCY SOLAR CELLS

(75) Inventor: Mark G. Mortenson, North East, MD (US)

(73) Assignee: GR Intellectual Reserve, LLC, Havre de Grace, MD (US)

( * ) Notice: Subject to any disclaimer, the term of this patent is extended or adjusted under 35 U.S.C. 154(b) by 0 days.

(21) Appl. No.: 10/478,189

(22) PCT Filed: May 16, 2002

(86) PCT No.: PCT/US02/15549

§ 371 (c)(1),
(2), (4) Date: Apr. 5, 2004

(87) PCT Pub. No.: WO02/093657

PCT Pub. Date: Nov. 21, 2002

(65) Prior Publication Data

US 2004/0154654 A1    Aug. 12, 2004

Related U.S. Application Data

(60) Provisional application No. 60/291,357, filed on May 16, 2001.

(51) Int. Cl.
*H01L 31/00*  (2006.01)
*H01L 31/0232*  (2006.01)

(52) U.S. Cl. ............... 136/252; 136/258; 136/260; 257/432

(58) Field of Classification Search ............ 136/246, 136/257, 259, 252, 290, 258, 260; 257/432, 257/436, 53

See application file for complete search history.

(56) References Cited

U.S. PATENT DOCUMENTS

| 3,076,861 | A | * | 2/1963 | Samulon et al. | 136/257 |
| 4,151,005 | A | * | 4/1979 | Strebkov et al. | 136/256 |
| 4,229,066 | A | | 10/1980 | Rancourt et al. | 350/1.6 |
| 4,367,367 | A | * | 1/1983 | Reisfeld et al. | 136/247 |
| 4,963,196 | A | * | 10/1990 | Hashimoto | 136/257 |
| 5,625,485 | A | * | 4/1997 | Bolger | 359/326 |

(Continued)

FOREIGN PATENT DOCUMENTS

WO    WO 2004/047153 A2 *  6/2004

OTHER PUBLICATIONS

Khurgin et al, "Heterodyning far-infrared light using coherent photovoltaic effect," Summaries of papers presented at the Conference on Lasers and Electro-Optics, CLEO 98, pp. 473-474, May 3-8, 1998.*

*Primary Examiner*—Alex Noguerola
(74) *Attorney, Agent, or Firm*—Mark G. Mortenson

(57) ABSTRACT

The present invention relates to improvements in solar cell and solar panel photovoltaic materials which cause the solar cells/panels to operate more efficiently. In particular, the present invention focuses primarily on matching or modifying particular incident light energies (e.g., from the sun) to predetermined energy levels in a solar cell photovoltaic substrate material required to excite, for example, electrons in at least a portion of the substrate material in a desirable manner. In this regard, for example, energy levels of incident light, and thus, corresponding particular wavelengths, such as desirable wavelength ($\gamma 1$), or frequenices of incident light, can be at least partially matched with various desirable energy levels in a substrate material by filtering out at least a portion of certain undesirable incident light, such as that of wavelength ($\gamma 2$), that comes into contact with at least a portion of a surface of a solar cell photovlataic substrate.

30 Claims, 3 Drawing Sheets

U.S. PATENT DOCUMENTS 5,689,335 A * 11/1997 Strauss ........................ 356/484

6,107,564 A * 8/2000 Aguilera et al. ............ 136/257

* cited by examiner

Wavelength in Nanometers

HIGH EFFICIENCY SOLAR CELLS

This application is a 371 of PCT/US02/15549, filed May 16, 2002, which claims benefit of provisional application 60/291,357, filed May 16, 2001.

FIELD OF THE INVENTION

The present invention relates to improvements in solar cell and solar panel photovoltaic materials which cause the solar cells/panels to operate more efficiently. In particular, the present invention focuses primarily on matching or modifying particular incident light energies (e.g., from the sun) to predetermined energy levels in a solar cell photovoltaic substrate material (e.g., a semiconductor material) required to excite, for example, electrons in at least a portion of the substrate material in a desirable manner (e.g., to cause desirable movement of electrons to result in output amperages previously unobtainable). In this regard, for example, energy levels of incident light, and thus, corresponding particular wavelengths or frequencies of incident light, can be at least partially matched with various desirable energy levels (e.g., electron band gap energy levels) in a substrate material by filtering out at least a portion of certain undesirable incident light that comes into contact with at least a portion of a surface of a solar cell photovoltaic substrate material; and/or modifying at least a portion of a solar cell photovoltaic substrate material such that such solar cell substrate material interacts favorably with particular desirable frequencies of incident light; and/or modifying particular undesirable light energies prior to them becoming incident on the photovoltaic substrate material to render such light energies more desirable for interactions with the photovoltaic substrate material.

BACKGROUND OF THE INVENTION

For many years, effort has been made to utilize the energy from the sun to produce electricity. It is well known that on a clear day the sun provides approximately one thousand watts of energy per square meter almost everywhere on the planet's surface. The historical intention has been to collect this energy by using, for example, an appropriate solar semiconductor device and utilizing the collected energy to produce power by the creation of a suitable voltage and to maximize amperage which is represented by the flow of electrons. However, to date, many photovoltaic cells typically have an overall efficiency as low as about 10–25%. In this regard, that means that when one thousand watts of energy are incident on a square meter of a typical photovoltaic cell, somewhere between about 100 and 250 watts of output energy power typically results. This typical low efficiency in solar cells has been a significant reason for the solar cell industry not growing faster. For example, it is relatively expensive to manufacture those semiconductor materials currently utilized for solar cells (e.g., crystalline silicon, amorphous silicon, cadmium sulfide, etc.) into solar panels (e.g., typically, a plurality of combined solar cells electrically connected together) which includes the high costs of forming the solar cell substrate materials themselves, the cost of modifying the substrate materials so that they can become photovoltaic (e.g., doping the semiconductor substrate material to create substrate p/n junctions, etc.), the placement of electron collecting grids on surfaces of the solar cells, manufacturing the solar cells into solar panels, etc.

For example, in regard to a first example of utilizing crystalline silicon, one traditional approach for manufacturing solar cells has included converting scrap silicon wafers from the semiconductor industry into solar cells by known techniques which include etching of the solar cells and subsequent processing of the silicon wafers so that they can function as solar cells. A second technique includes creating relatively thin layers of crystalline and/or amorphous silicon upon an appropriate substrate and then utilizing somewhat similar subsequent processing steps to those discussed above to result in a solar cell/solar panel. In each of these two general approaches to obtaining a suitable photovoltaic substrate, the semiconducting nature of the silicon is utilized so that when incident light strikes a doped (e.g., a p-type and/or an n-type doped material) silicon solar cell substrate material, the incident light can be at least partially absorbed (e.g., a photon of light corresponding to a certain amount of energy can be absorbed) into the silicon semiconductor. The absorbed photon results in a transfer of energy to the semiconductor and the transferred energy can result in electron flow in a circuit (e.g., along with, for example, paired electron holes flowing in an opposite direction). A flow of electrons is typically referred to as a current. Solar cells of this type also usually will have a particular voltage associated with the produced current. By placing or positioning appropriate metal collecting electrodes on, for example, the top and bottom of the silicon semiconductor material, the electrons produced can be extracted from the cell as current which can be used, for example, to power an appropriate external device and/or charge a battery. However, this entire process has historically been relatively inefficient, making the solar cell industry less than ideal.

Accordingly, there has been a long felt need to enhance the efficiency of solar cells so that the cost of electricity produced by the solar cell approach can be reduced and thus assist in making a meaningful impact on the world power supply by, for example, decreasing the world's dependency on fossil fuels and/or nuclear energy. The present invention satisfies this long felt need by a novel, simple and reliable approach.

SUMMARY OF THE INVENTION

The present invention has been developed to overcome certain shortcomings of the prior art photovoltaic materials as well as those techniques used for the manufacture of numerous compositions of solar cells/solar panels.

It is an object of the invention to produce solar cells out of various known photovoltaic substrate materials which, in some cases, can be caused to have higher efficiencies without significantly modifying, if at all modifying, such substrate materials, relative to known substrate materials used in solar cells.

It is an object of the invention to apply the techniques and methodology of the invention to at least the photovoltaic substrate materials which include, but are not limited to, crystalline silicon, amorphous silicon, single crystal silicon, cadmium sulfide, gallium arsenide, GaAs/Ge, GaInP$_2$/GaAs/Ge, copper-indium diselinide, GaInNAs, GaSb, In GaAs, SiGe, TiO$_2$, AlGaAs, CuInS$_2$, Fullerene C$_{60}$ and carbonaceous thin films.

Another object of the invention is to limit or restrict certain undesirable incident wavelengths of light (and thus certain frequencies and energy levels) from becoming incident upon a solar cell photovoltaic substrate.

It is another object of the invention to limit or restrict (i.e., minimize) certain destructively interfering (or at least partially destructively interfering) incident wavelengths of light from becoming incident upon a solar cell photovoltaic substrate so as to maximize the incidence of constructively interfering (or at least partially constructively interfering) incident wavelengths which, for example, substantially match those wavelengths (e.g., amounts of energy) which cause desirable interactions to occur between the incident light and the solar cell substrate (e.g., excite electrons from a substrate into an appropriate energy collection system on the substrate (e.g., a conductive grid), to produce desirable electrical current). Moreover, the incident light energy can be converted to desirable atomic or molecular energies (e.g., electronic) and thus, for example, further energize the electrons to assist in the production of electrical power.

It is an object of the invention to determine which particular energies (and thus which particular wavelengths or frequencies) of incident light are required for any desired solar cell photovoltaic substrate to permit desirable interactions to occur (e.g., for electrons to be excited from one energy level to another to result in current; to provide energy to the electrons which can assist in promoting the electrons to a conduction band to result in current; and after determining which energies (and thus which wavelengths or frequencies) are desirable, substantially restricting the wavelengths or frequencies of undesirable incident light upon said substrate by utilizing an appropriate filtering technique or light modifying (e.g., shifting, refracting, etc.) technique, thus maximizing those desirable energies of light which contact or are incident upon a solar cell substrate.

It is another object of the invention to restrict and/or modify the wavelengths of light which are incident upon an appropriate solar cell substrate by utilizing at least one external means for modifying incident sunlight (e.g., a filter or a combination of external filters, a light refracting means, and/or a light reflecting means, etc.), which maximize(s) those desired wavelengths to be incident upon a solar cell photovoltaic substrate. Such external means which include filters, or combinations of external filters, can be incorporated into an original manufacturing process or can be later added (e.g., as a coating) as, for example, a retrofitting step to existing solar cells or solar panels.

It is another object of the invention to provide at least one filter for filtering out certain wavelengths of undesirable incident light by providing a particular covering material in a solar cell which functions as a filter. In this regard, an appropriate covering material can be, for example, suitable polymer material(s) (including certain monomer(s) and/or oligomer(s)), or suitable glass(es), suitable coatings, and/or combinations of the same.

It is an object of the invention to provide a glass cover material which is capable of filtering, refracting and/or reflecting out as many undesirable wavelengths of incident light as possible and thus maximizing the incidences of those wavelengths of light which desirably interact with a solar cell photovoltaic substrate material after passing through such a cover material.

To achieve all of the foregoing objects and advantages, and to overcome the disadvantages of the prior art solar cell and solar panel designs, the present invention utilizes a number of novel approaches.

Typical photovoltaic materials convert sunlight directly into electricity. Photovoltaic cells typically utilize materials known as semiconductors such as crystalline silicon, amorphous silicon, single crystal silicon, cadmium sulfide, gallium arsenide, etc., as a substrate or active material in the solar cell. Of these materials, crystalline silicon is currently one of the most commonly used. When sunlight strikes (i.e., is incident upon) a semiconductor material, it is known that certain energy units within sunlight, known as, and referred to as, photons, can be absorbed into the semiconductor material. This typically results in some portion of the energy of incident sunlight being transferred to the semiconductor material. This transfer of energy can cause, for example, electrons to be excited from their ground state into one or more excited states which permits such electrons, in certain cases, to flow somewhat freely within at least a portion of the semiconductor material (e.g., within a conductor or conduction band in the semiconductor material). These photovoltaic materials or cells also have at least one electric field which tends to force electrons to flow in a particular direction, such electrons having been created by the absorption of light energy (i.e., photons) into the semiconductor material. The flow of electrons is typically regarded and referred to as a current. By placing appropriate electrodes (e.g., one or more metal grids) on the front and back side of a photovoltaic cell, the flow of electrons can generate a current which can be used to drive electric motors, charge batteries, etc. It is the flow of electrons or current, combined with the voltage produced by the cell (e.g., which is a direct result of any built-in electric field or fields), which defines the total output or power that a solar cell, or group of solar cells in a panel or array, can produce.

The following discussion places particular emphasis on crystalline silicon, however, such discussion applies in a parallel manner to other photovoltaic materials as well. An atom of silicon is known to have 14 electrons in three different shells. The first two of these shells closest to the nucleus are regarded as being completely filled with electrons. However, the outer shell is regarded as being only half full and contains only four electrons. This is what makes crystalline silicon, when appropriately doped, a good semiconductor material and thus useful as a solar cell substrate material. In this regard, an individual silicon atom is considered to be driven to attempt to fill its outermost shell with eight electrons. In order to fill its outermost shell, the silicon atom is thought to need to share electrons with, for example, four of its neighboring silicon atoms. This attempt to share electrons with neighboring silicon atoms is essentially what forms the crystalline structure of silicon and this structure is important to the formation of this type of photovoltaic cell.

In most cases, silicon desirably includes dopants which are added to the crystalline structure to cause the silicon to work as a better semiconductor. Traditional dopants that have been historically used in the manufacture of crystalline silicon semiconductor materials include boron, phosphorous, indium, etc., the particular dopant(s) being chosen to result in desired p-type and/or n-type characteristics of at least a portion of a semiconductor. A more complete list of dopants than those listed above that have been used with a variety of different photovoltaic materials include, but are not limited to, germanium, beryllium, magnesium, selenium, cadmium, zinc, mercury, oxygen, chlorine, iodine and organometallic dyes (e.g., $Rv(SCN)_2C_2$). The purpose of these dopants is to cause, for example, the silicon to function as a better semiconductor material. By utilizing suitable dopants, the amount of energy required to be input into, for example, a silicon semiconductor to produce or promote electrons to flow is reduced significantly relative to an undoped silicon semiconductor material because in doped silicon, the electrons are not bound in a chemical bond in the same way that undoped silicon electrons are. It is desirable to have present in different portions of a silicon-based solar cell, each of an n-type behavior and a p-type behavior. For example, phosphorous can be added as a dopant to result in an n-type semiconductor portion of a silicon material and boron can be added to another portion of a semiconductor material to result in a p-type portion in a silicon semiconductor material N-type doped materials are typically associated with the letter "n" because such materials have the presence of free electrons (i.e., n=negative); whereas p-type materials are typically associated with the letter "p" because such materials have free holes (i.e., the opposite of electrons and p=positive). The concept of holes is viewed as being important in a solar cell semiconductor material because holes are thought to be the equivalent to the absence of electrons which carry a positive charge in an opposite direction from the electron flow and are thought to move around like electrons.

Accordingly, when both p-type and n-type portions or materials are combined into a single material, at least one electric field will form due to the n-type and p-type portions of silicon being in contact with each other. In particular, free electrons on the n-side of the semiconductor recognize the presence of holes on the p-side of the semiconductor and attempt to fill in these holes by moving there. For example, in the junction between n-type and p-type portions or sections within a semiconductor material, there is a mixture of holes and electrons which reach equilibrium and thus create at least one electric field separating the two sides. This field actually functions as a diode which permits (e.g., in some cases even pushes) electrons to flow from the p-side to the n-side (e.g., but, typically, not the other way around).

Accordingly, when photons of light become incident upon the semiconductor material, the photons of light contain a certain amount of energy "E". This amount of energy "E" is equal to Planck's constant "h" multiplied by the frequency of the light. In this regard, the well-known relationship is as follows:

$$E=h\nu \qquad \text{Equation 1}$$

These photons of a particular energy, and thus of a particular wavelength and frequency, are capable of transferring energy to electrons in the semiconductor material (e.g., promoting electrons from lower energy states into, for example, the conduction band) as well as being capable of creating holes. If the electrons and/or holes are created close enough to the electric field, or if they can wander within a range of influence of such field, the field will typically send an electron to the n-side of the semiconductor and a hole to the p-side of the semiconductor. This movement of electrons and holes will result in further disruption of the electrical neutrality and if an external collection system (e.g., electrical grid) is provided, electrons will flow into and through this grid to their original side (i.e., the p-side) to unite with corresponding holes that the electric field has also sent there. This flow of electrons provides the current, as well as the electric field(s), resulting in a voltage. When both current and voltage are present, power can be created in, for example, an external device.

Traditional photovoltaic theory recognizes that incident sunlight is comprised of a number of different wavelengths of light (e.g., infrared, visible, ultraviolet, etc) and thus includes a virtual continuum of different energies, as well as a virtual continuum of different frequencies, most all of which energies/wavelengths/frequencies (e.g., especially in the range of about 200 nm to about 1200 nm wavelength) have been traditionally viewed as positively interacting with a semiconductor material, as well as some of which energies/wavelengths/frequencies being traditionally viewed as not really causing any positive (or negative) results. In this regard, it has been previously viewed by the prior art for example, that some incident light does not have sufficient energies to form an electron-hole pair and in such cases these photons may simply pass through the solar cell without any positive or negative interactions with the solar cell. Additionally, it has also been traditionally believed that some photons have too much energy and simply can not interact completely with the solar cell material (e.g., there may be some interactions, but the interaction may be incomplete or that not all of the energy of the photon is, or can be, used by the solar cell).

It is known, for example, that one band gap energy that can be made to exist in doped crystalline silicon is about 1.1 eV (1.1 electron Volts). This amount of energy is known as an amount of energy which is required to, for example, free a bound electron to become a freely flowing electron which can be involved in the flow of a current. It has been believed historically that photons having more energy than what is required to free an electron may simply not utilize all of the energy to free an electron and such excess energy is simply lost, whereas it has also been believed that photons that do not have enough energy to free an electron to become involved in the flow of a current simply do not interact at all with the semiconductor material. Thus, it has been believed historically that photons having less than required amounts of energy or more than required amounts of energy (as discussed above) do not interact in a positive or a negative way and such non-interaction has been traditionally blamed as being responsible for the loss of the effectiveness (e.g., in some cases about 70–90%) of the radiation or sunlight energy which is incident on a solar cell. Some approaches to increase the efficiency of solar cells have suggested reducing the required band gap energy to a smaller number by utilizing an appropriate combination of dopants, but there is unfortunately a negative impact associated with such approaches. Particularly, the amount of band gap energy that can be designed into a solar cell substrate material (e.g., crystalline silicon) is limited, because, even though a small band gap may result in the production of more electrons, the traditional view would be that because more photons could be utilized, the width of the band gap also determines the strength of the electric field. Accordingly, if the band gap is too small, even though extra current is provided by the ability of a material, in theory, to absorb more photons and thus promote more electrons to a conduction band, the power output of the cell is lowered because a much smaller voltage is produced In this regard, power is the multiplied effect of voltage times current (i.e., P=VI). In attempting to balance the two effects of current and voltage, one ideal band gap width for silicon has been determined to be about 1.4 eV (1.4 electron volts) for a cell made from a single material suitably doped.

However, the prior art has not recognized some very important negative effects which impact adversely on the power output of a solar photovoltaic cell. As discussed above, the historical view has been that when incident photons are of too low an energy, the photons do not positively interact with the solar cell semiconductor material, and when photons are of too high an energy, some of the energy may be caused to interact with the solar cell semiconductor material and some of the energy of the photon is simply lost and does not take part in the interaction. However, what all prior art approaches fail to recognize is that there are negative power effects or negative consequences that can result when energies, specifically, incident frequencies or wavelengths, which do not specifically match, for example, the band gap energies present in the semiconductor material. In this regard, the most efficient or highest output from a solar cell would occur when those energies which impart desirable effects (e.g., the controlled excitation of an electron and/or electron hole pair) are applied to (e.g., light incident upon) a photovoltaic material. For example, since light waves are comprised of photons that have been traditionally represented by a wave, when waves or frequencies (i.e., energies according to Equation 1) do not match (e.g., do not match directly or indirectly or are not harmonics of and/or are not heterodynes of particular energies) with the particular energies required to, for example, generate an electron/hole pair (e.g., promote electrons to the conduction band) the particular component wave or frequency of light incident on the solar cell actually may detract or interfere with the production of power from a solar cell (e.g., desirable interactions with photons or waves of light may be at least partially, or substantially completely, offset by negative interactions).

Moreover, it should also be clear that positive or desirable effects include, but are not limited to, those effects resulting from an interaction (e.g. heterodyne, resonance, additive wave, subtractive wave, partial or complete constructive interference or partial or complete destructive interference) between a wavelength or frequency of incident light and a wavelength (e.g., atomic and/or molecular, etc.), frequency or property (e.g., Stark effects, Zeeman effects, etc.) inherent to the substrate itself. Accordingly, by providing substantially only those energies (i.e., wavelengths and frequencies) of light required to cause desirable excitations in the solar cell photovoltaic materials (e.g., the formation of electron/hole pairs) the entire solar cell actually becomes more efficient In some cases it may be difficult, if not impossible, to provide only those energies which provide desirable interactions, however, if as many undesirable energies as possible can be blocked, eliminated and/or modified prior to contacting the solar cell photovoltaic material, then the power output of the solar cell will be enhanced. This approach is contrary to the prior art approaches which have attempted to design semiconductor materials such that they may interact directly, or through, for example, various light trapping approaches, with an even broader spectrum of available light energies without regard to limiting particular "negative" light energies from being incident on the solar cell substrates (e.g., limiting incident energies to those partial energy levels (frequency and wavelength) that can result in desirable outputs from the solar cells without any substantial undesirable interactions occurring, due to, for example, utilizing energies of light which actually interfere with the production of power).

Accordingly, the present invention satisfies the long felt need in the solar cell industry to render solar cells more efficient by recognizing that it is not desirable for all wavelengths of light within any particular spectrum of light (e.g., natural sunlight) to be incident upon a solar cell photovoltaic substrate (e.g., crystalline silicon, amorphous silicon, single crystal silicon, cadmium sulfide, etc.) but rather to reduce or limit the incident light to as many of those wavelengths as possible which can result in predominantly desirable interactions between the incident light and the solar cell's photovoltaic substrate (i.e., in other words, to reduce as many negative or destructively interfering wavelengths of light as possible so as to reduce negative effects of, for example, destructive interference occurring in the photovoltaic substrate).

In this regard, there will be a particular combination of specific frequencies of light (Note: light can be referred to by energy, wavelength and/or frequency, but for simplicity, will be referred to in these paragraphs immediately following primarily as "frequency" or "wavelength") that will desirably interact with a solar cell's photovoltaic substrate. The particular frequencies of light that should be caused to be incident upon a solar cell photovoltaic substrate should be as many of those frequencies as possible which can result in desirable effects (e.g., promoting electrons to a conduction band) within the substrate, while eliminating as many of those frequencies as possible which result in undesirable effects within the substrate. In this regard, certain frequencies will add energy to the photovoltaic material by, for example, causing atomic or molecular energies (e.g., electronic) to be provided; certain frequencies of light will cause electrons to jump the band gap and/or form electron/hole pairs. It is important to note that virtually all of the desirable energies which can be applied to an appropriate photovoltaic substrate material can be calculated theoretically, or determined empirically. For example, if one knows the band gap width that is created within a semiconductor material due to, for example, the doping of the semiconductor with one or more suitable dopants, or the combination of band widths present in the material due to, for example, utilizing multiple suitable dopants, then those particular frequencies of light can be applied so that, for example, electron/hole pairs can be created and/or additional desirable energies can be imparted to, for example, electrons. For example, assuming arguendo that a band width created within a doped silicon semiconductor substrate required a wavelength of, for example, 600 nm, to create an electron and/or electron/hole pair, then the application of a wavelength of light of about 600 nm would be a very desirable and very effective wavelength to apply. However, all harmonics of a wavelength of 600 nm would also be desirable (e.g., 1200, 1800, 300, 150, etc.). In addition, many heterodynes of 600 nm would be desirable (e.g., If the material has wavelengths 600 nm and 100 nm, the substractive heterodyne is 400 nm and the additive heterodyne is 1600 nm. In addition to the actual frequencies of the material, i.e. 600 nm and 1000 nm, the heterodyned frequencies, i.e. 400 nm and 1600 nm may also be beneficial.) Additionally, in this example, while the exact wavelength of 600 nm would be the optimum wavelength to apply (as well as all those wavelengths corresponding to the exact harmonic and exact heterodyne wavelengths) wavelengths which are close to the 600 nm wavelength and thus that are close to the exact harmonic and/or close to the exact heterodyne wavelengths would also be desirable to apply. In this regard, FIG. 4 shows a typical bell-shaped curve "B" which represents a distribution of frequencies around the desired frequency $f_0$.

FIG. 4 thus represents additional desirable frequencies that can be applied which do not correspond exactly to $f_0$, but are close enough to the frequency $f_0$ to achieve a desired effect. In particular, for example, those frequencies between and including the frequencies within the range of $f_1$ and $f_2$ would be most desirable. Note that $f_1$ and $f_2$ correspond to those frequencies above and below the resonant frequency $f_0$, wherein $f_1$, and $f_2$ correspond to about one half the maximum amplitude, $a_{max}$, of the curve "B". However, in practice, depending on the particular semiconductor material utilized, some frequencies slightly beyond those represented by the range of frequencies between $f_1$, and $f_2$ may also be desirable.

In addition to the harmonic and heterodyne frequencies (wavelengths) discussed above, particular energies which provide, for example, atomic or molecular energies (e.g., electronic) can also be permitted to interact with the photovoltaic substrate because providing such energies to the substrate material also is desirable in that energy is being transferred in a desirable manner to the photovoltaic substrate material.

Still further, in some instances certain blocks or regions of incident light may be desirable to prevent from contacting a photovoltaic material. In this regard it may be desirable to block out complete portions of infrared wavelengths and/or complete portions of ultraviolet wavelengths to improve performance.

The precise combination of wavelengths or frequencies (and thus energies) that can be permitted to interact with solar cell photovoltaic substrates are important to determine, because essentially the desirable frequencies should be maximized, while the undesirable frequencies should be minimized.

There exist numerous theoretical and empirical means for determining desirable and undesirable frequencies (and thus energies) of incident light which should be obvious to those of ordinary skill in this art. In addition, there are numerous means for limiting undesirable frequencies incident upon a substrate material. Some of these different means are discussed later herein.

BRIEF DESCRIPTION OF THE FIGURES

The following Figures are provided to assist in the understanding of the invention, but are not intended to limit the scope of the invention Similar reference numerals have been used wherever in each of the Figures to denote like components; wherein.

DETAILED DESCRIPTION OF THE INVENTION

Figure 1:
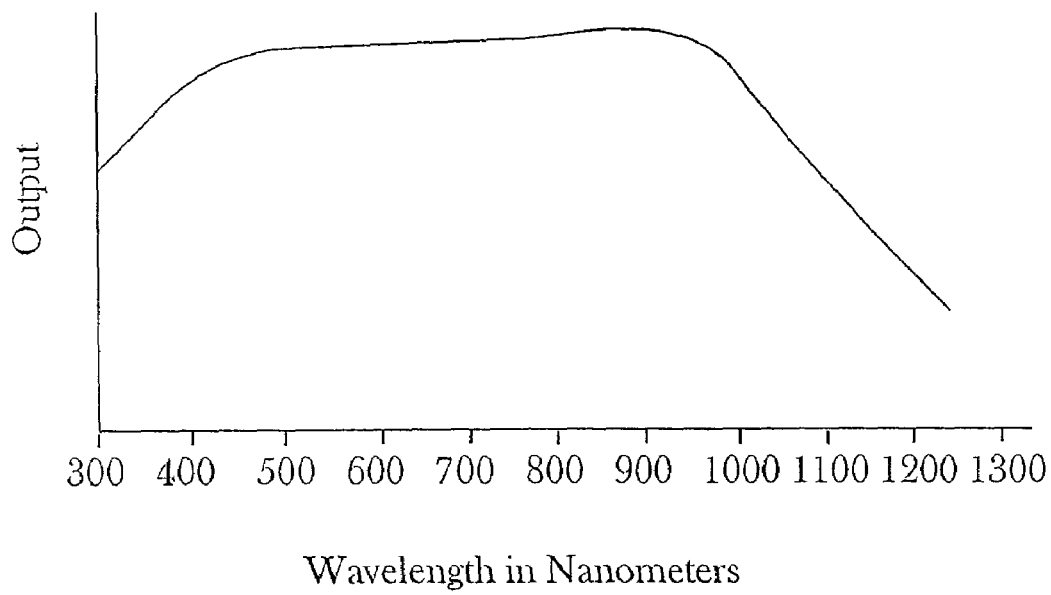
FIG. 1 is a general graphical representation of a typical output response of a crystalline silicon solar cell as a function of wavelength of incident sunlight.

FIG. 1 shows a typical output response for a crystalline silicon solar cell. In this regard, the x-axis corresponds to wavelengths from about 300 nanometers to about 1400 nanometers, which is the typically desired response range that traditional solar cell manufacturers have sought for the photovoltaic material(s) comprising the solar cell. The y-axis corresponds to a particular output present at various measured wavelengths along the x-axis. The prior art is replete with attempts to describe means for utilizing more and more of the wavelengths contained in sunlight (e.g., light trapping techniques, etc.), however, the prior art misses the point that undesirable effects can also occur at the same time that certain desirable effects are occurring resulting in a canceling or blocking out of some of the desirable effects.

Figure 2:
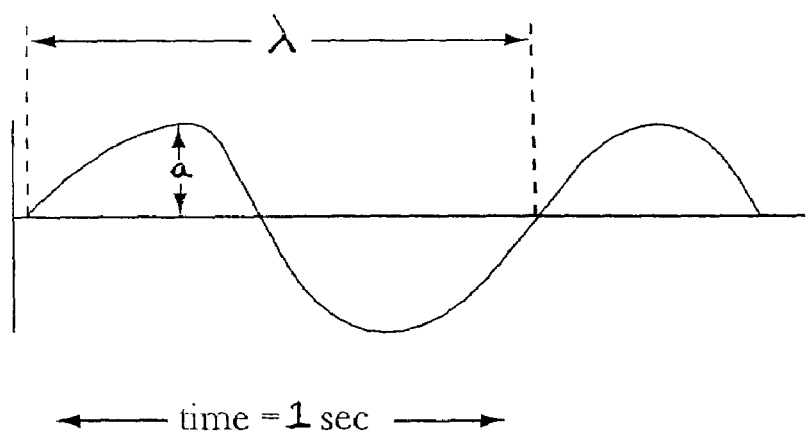
FIG. 2 shows a sine wave which is representative of incident sunlight.

In this regard, for example, FIG. 2 shows a first sine wave which corresponds to a particular wavelength "λ", a certain amplitude "a" and a frequency of 1 cycle per second "ν". When the frequency of the sine wave matches perfectly, for example, the band gap energy in a semiconductor material, then substantially all of the energy in the sine wave is transferred into the creation of, for example, an electron/hole pair. However, when the frequency does not match exactly, the prior art believes that some of the energy may or may not be involved in desirable effects in the photovoltaic substrate material, but the prior art does not recognize that those frequencies which do not match desirable energy levels in a photovoltaic material actually may provide deleterious effects. These deleterious effects can be shown in, for example, FIG. 3.

Figure 3:
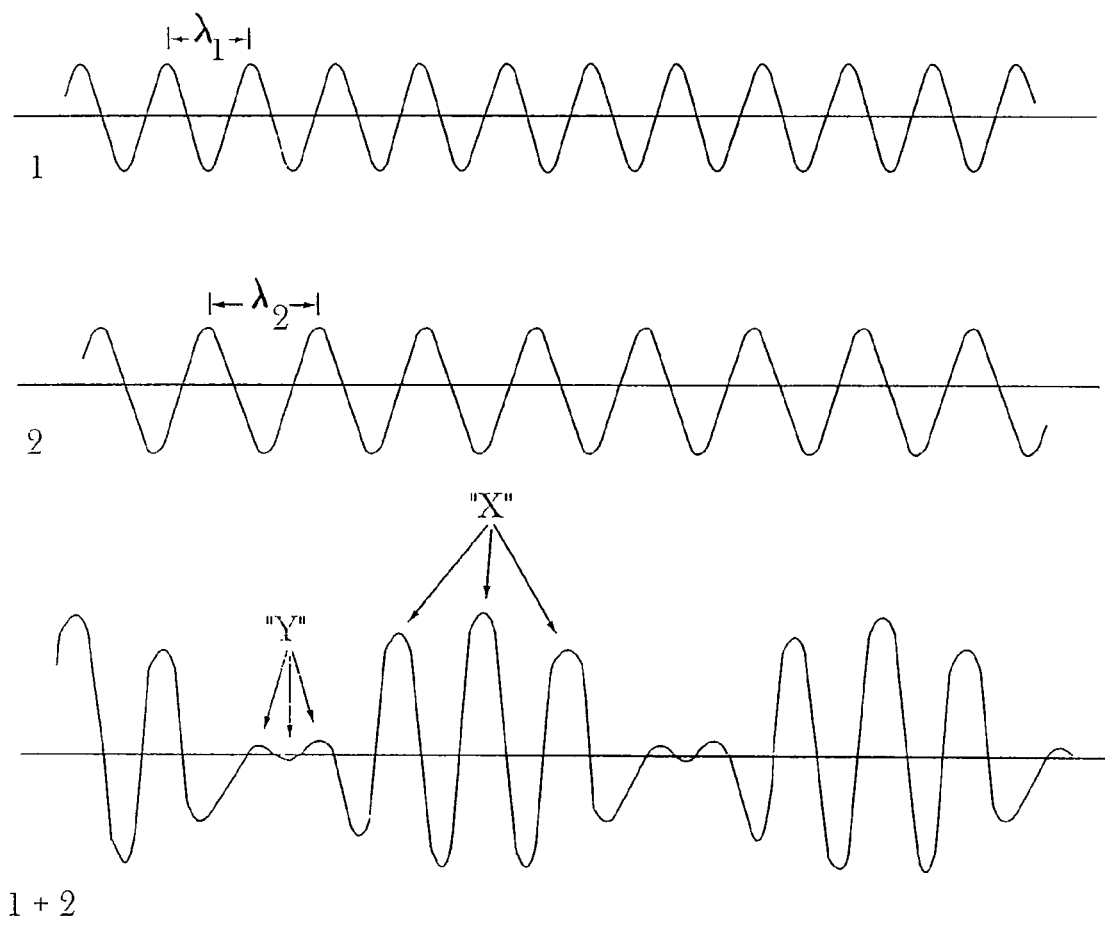
FIG. 3 shows a first desirable sine wave 1, a second undesirable sine wave 2 and a combination of the waves 1+2 showing both constructive and destructive interference effects.
Figure 4:
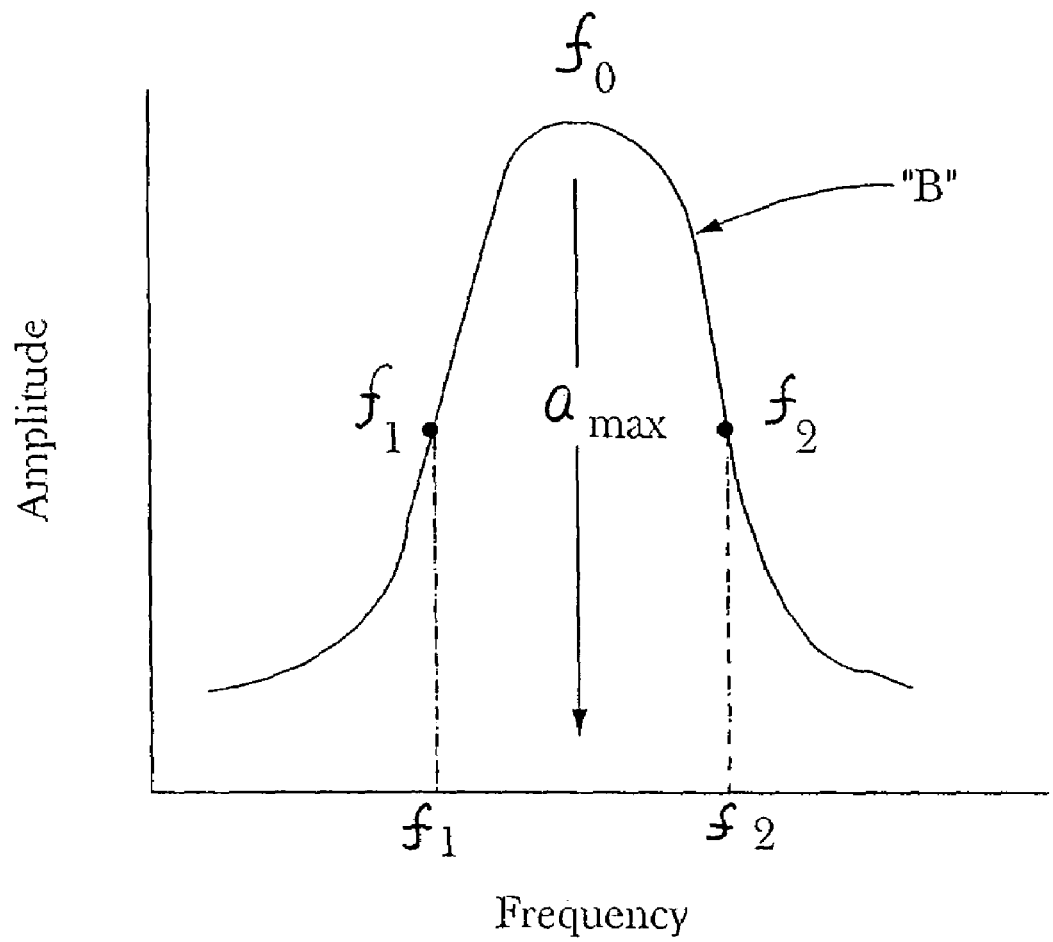
FIG. 4 is a graphical representation depicting the bell-shaped curve of frequencies surrounding a particular representative desirable frequency of light $f_0$.

FIG. 3 shows two different incident sine waves 1 and 2 which correspond to two different energies, wavelengths $\lambda_1$ and $\lambda_2$ (and thus different frequencies) of light (or photons) which could be made to be incident upon the surface of a photovoltaic solar cell substrate material. Each of the sine waves 1 and 2 has a different differential equation which describes its individual motion. However, when the sine waves are combined into the resultant additive wave 1+2, the resulting complex differential equation, which describes the resultant combined energies, actually results in certain of the input energies being high (i.e., constructive interference) at certain points in time, as well as being low (i.e., destructive interference) at certain points in time.

In particular, assuming that the sine wave 1 corresponds to desirable incident energy having a wavelength $\lambda_1$, which would result in positive or favorable effects if permitted to be incident on a solar cell substrate; and further assuming that the sine wave 2 corresponds to undesirable incident energy having a wavelength $\lambda_2$, which would not result in positive or favorable effects if permitted to be incident on a solar cell substrate, then the resultant additive wave 1+2 shows some interesting characteristics. For example, the portions "X" represent areas where the two waves 1 and 2 have at least partially constructively interfered, whereas the portions "Y" represent areas where the two waves 1 and 2 have at least partially destructively interfered. Depending upon whether the portions "X" corresponds to desirable or undesirable wavelengths (i.e., resulting in positive or negative interactions with the substrate, respectively) then the portions "X" could enhance a positive effect in a substrate or could enhance a negative effect in a substrate. Similarly, depending on whether the portions "Y" correspond to desirable or undesirable wavelengths, then the portions "Y" may correspond to the effective loss of either a positive or negative effect.

It should be clear from this particular analysis that partial or complete constructive interferences (i.e., the points "X") could maximize both positive and negative effects and that partial or complete destructive interferences "Y" could minimize both positive and negative effects. Accordingly, in this simplified example, by permitting predominantly desirable wavelengths $\lambda_1$ to be incident upon a semiconductor surface, the possibilities of negative effects resulting from the combination of waves 1 and 2 would be minimized or eliminated. In this regard, it is noted that in practice many desirable incident wavelengths can be made to be incident on a surface of a photovoltaic substrate material. Moreover, it should also be clear that positive or desirable effects include, but are not limited to, those effects resulting from an interaction (e.g., heterodyne, resonance, additive wave, subtractive wave, partially or substantially complete constructive interference, or partially or substantially complete destructive interference) between a wavelength or frequency of incident light and a wavelength (e.g., atomic and/or molecular, etc.), frequency or property (e.g., Stark effects, Zeeman effects, etc.) inherent to the substrate itself. Thus, by maximizing the desirable wavelengths (or minimizing undesirable wavelengths), solar cell efficiencies never before known can be achieved. Alternatively stated, certain destructive interference effects resulting from the combinations of different energies, frequencies and/or wavelengths can reduce the output in a solar cell photovoltaic substrate material. The present invention attempts to mask or screen as many of such undesirable energies (or wavelengths) as possible from becoming incident on the surface of a photovoltaic substrate and thus strive for, for example, the synergistic results that can occur due to, for example, desirable constructive interference effects between the incident wavelengths of light.

For example, it is known that glasses of various compositions can absorb, refract and/or reflect certain radiation which comes from the sun. Glasses can be manufactured so that they contain various elements in their structure that can absorb photons of particular energies (and thus wavelengths and frequencies) such that such absorbed energy does not find its way to a material (e.g., a photovoltaic substrate) located behind such glasses.

One exemplary empirical method to determine which wavelengths are the most desirable to be permitted to be incident upon a surface of a photovoltaic substrate utilize a concept related generally to that concept used in a tunable dye laser. Specifically, for example, a tunable die laser, generally, outputs multiple frequencies (or energies) of light from a laser source into a prism. The prism then separates or diffracts the multiple frequencies of light as an output The multiple frequency output from the prism can then be selectively gated by an optical slit (e.g. a micrometer driven grating) which can be precisely positioned to permit transmission of only limited or desired frequencies therethrough. This selective positioning of the optical slit is what causes the laser to be tunable. By utilizing a device which uses one or more blocking portions (e.g., preferably a plurality) of blocking portions rather than an optical slit wavelengths which are deleterious undesirable for the performance of a solar cell can be determined. The blocking portions can be of any suitable height and width to achieve the desirable blocking of wavelength of light.

Accordingly, once it is determined, either theoretically or empirically, which wavelengths are the most desirable to be permitted to be incident upon a surface of a photovoltaic substrate material, then glass can be designed to, for example, absorb as many wavelengths of light as possible except for those wavelengths which result in positive interactions. In this regard, it is well known in the glass industry how to incorporate certain "impurities" into glasses to cause them to absorb various frequencies of light Thus, the glass can be viewed simply as functioning as a filter (when added to an existing solar cell or panel (e.g., retrofitting) or inherently being part of the manufacture of a solar cell or solar panel when originally manufactured) which does not permit certain wavelengths of light to pass therethrough, or rather, permit as many desirable wavelengths of light as possible to pass therethrough. In addition, certain coatings can be placed directly upon an incident surface of a photovoltaic substrate material functioning as a solar cell to assist in blocking certain energies (or wavelengths or frequencies) of light to be incident thereon. In this regard, there may be a need to produce a sandwich or layered structure of materials, for example, on a front surface of a solar cell photovoltaic substrate material such that the combination of materials actually serve to breakup or prevent certain light from being incident on a photovoltaic surface located behind the layered structure. Further, rather than merely capturing or absorbing undesirable light energies, it would be possible, through the use of for example, certain physical structures, to cause certain wavelengths of light to be refracted, reflected or otherwise modified and minimize particular undesirable wavelengths, frequencies and/or energies to be incident on a surface of a solar cell photovoltaic substrate material.

Furthermore, certain monomer, oligimer, polymer and/or organometallic materials could also be desirable surface materials that could be used alone or in combination with, for example, certain glass materials in an attempt to achieve the goals of the invention, namely, to maximize particular desirable wavelengths, frequencies and/or energies to be incident on a surface of a solar cell substrate material or, alternatively, to minimize particular undesirable wavelengths, frequencies and/or energies from being incident on a surface of a solar cell substrate.

Moreover, in certain cases it may be desirable to utilize an iterative-type process, whereby certain solar cell materials are modified slightly in conjunction with the filtering or blocking and/or light refracting materials (e.g., at least one means for modifying incident sunlight prior to sunlight contacting the photovoltaic substrate) which are provided on at least one surface thereof. In this regard, it is well known that different dopants can be utilized in different semiconductor materials and that different dopants (or combinations of dopants) can result in different, for example, band gaps or band gap energy widths within a photovoltaic material, as well as different atomic or molecular energies (e.g., electronic which can be excited). Thus, it may be more advantageous to manufacture a particular type of photovoltaic substrate material to be used in conjunction with, for example, certain coverings and/or filters. The combination of the photovoltaic material and the covering and/or filtering material(s) may be different for different applications where the solar cells may experience, for example, higher or lower water contents in the atmosphere, higher or lower energies, higher or lower operating temperatures, etc., all of which factors can influence, for example, band gaps or energy levels within a photovoltaic substrate. All of such factors can be taken into account when designing a system such that the resultant system can provide the maximum effectiveness for the particular solar cells and/or solar panels. Moreover, in a similar regard, certain solar cell applications may find themselves in high temperature environments such as deserts, near the Equator, etc., whereby the operating temperature of the solar cells could be much higher relative, for example, the Arctic or Antarctic, outer space, etc. These higher temperatures can also influence energy levels within a photovoltaic substrate material. In addition, for example, photovoltaic materials located in outer space will, typically, be exposed to frequencies which are different from those frequencies which are incident on similar photovoltaic materials, located, for example, in the earth's atmosphere at sea level. In this regard, the particular combination of solar cell photovoltaic material and at least one means for modifying incident sunlight (e.g., a covering or filter material) may be different in one application or environment versus another. However, it is the goal of the invention that once the particular environment in which the solar cell is going to be operating in is understood, that the most desirable combination of solar cell substrate and covering or filter can be utilized in combination with each other.

While there has been illustrated and described what is at present considered to be the preferred embodiments of the present invention, it will be understood by those skilled in the art that various changes and modifications may be made, and equivalents may be substituted for elements thereof without departing from the true scope of the invention In addition, many modifications may be made to adapt the teachings of the invention to a particular situation without departing from the central scope of the invention. Therefore, it is intended that this invention not be limited to the particular embodiments disclosed as the best mode contemplated for carrying out this invention, but that the invention will include all embodiments falling within the scope of the appended claims.

What is claimed is:

1. A device for producing the flow of electrons due to solar energy being incident thereon comprising:
    at least one solar cell photovoltaic substrate material;
    means for determining at least one primary band gap width present in a solar cell substrate material;
    means for determining at least one primary frequency of light corresponding in energy to said at least one primary band gap width;
    means for determining at least one harmonic and at least one heterodyne of said at least one primary frequency of light; and
    at least one means for modifying sunlight positioned between said at least one solar cell photovoltaic substrate material and incident sunlight, whereby said at least one means for modifying sunlight permits limited energies of sunlight from about 300 nanometers to about 1400 nanometers corresponding approximately only to said at least one primary frequency, said at least one harmonic and said at least one heterodyne to pass therethrough, so as to reduce negative interactions within said solar cell photovoltaic substrate material relative to unfiltered incident sunlight.

2. The device of claim 1, wherein said at least one means for modifying sunlight comprises at least one material.

3. The device of claim 2, wherein said at least one material comprises at least one cover material which covers at least a portion of at least one surface of said at least one solar cell photovoltaic substrate material.

4. The device of claim 1, wherein said at least one solar cell photovoltaic substrate material comprises at least one semiconductor material.

5. The device of claim 4, wherein said at least one semiconductor material comprises at least one material selected from the group consisting of amorphous silicon, crystalline silicon and cadmium sulfide.

6. The device of claim 1, wherein said at least one means for modifying sunlight minimizes the amount of destructively interfering frequencies of sunlight incident on said photovoltaic substrate material.

7. The device of claim 1, wherein said at least one harmonic comprises all harmonics.

8. The device of claim 1, wherein said at least one heterodyne comprises all heterodynes.

9. The device of claim 1, wherein said at least one primary frequency corresponds to a plurality of primary frequencies of light, said at least one harmonic corresponds to a plurality of harmonics and said at least one heterodyne corresponds to a plurality of heterodynes.

10. The device of claim 9, wherein said plurality of primary frequencies correspond to those frequencies which are distributed symmetrically about a primary frequency which corresponds to said at least one primary band gap width, said plurality of primary frequencies including all of those frequencies which correspond up to at least about one-half of the maximum amplitude associated with said primary frequency.

11. The device of claim 9, wherein said plurality of harmonics correspond to those frequencies which are distributed symmetrically about each harmonic frequency and which comprise those frequencies which correspond up to at least about one-half of the maximum amplitude associated with each said harmonic frequency.

12. The device of claim 9, wherein said plurality of heterodynes correspond to those frequencies which are distributed symmetrically about each heterodyne frequency and which comprise those frequencies which correspond up to at least about one-half of the maximum amplitude associated with each said heterodyne frequency.

13. A method of increasing the efficiency of a solar cell photovoltaic substrate material comprising:
    determining at least one primary band gap width present in a said solar cell photovoltaic substrate material;
    determining at least one primary frequency of light corresponding in energy to said at least one primary band gap width;
    determining at least one harmonic and at least one heterodyne of said at least one primary frequency of light; and
    providing at least one means for filtering sunlight such that said at least one means permits limited energies of sunlight from about 300 nanometers to about 1400 nanometers corresponding approximately only to said at least one primary frequency, said at least one harmonic and said at least one heterodyne to pass therethrough, so as to reduce negative interactions within said solar cell photovoltaic substrate material relative to unfiltered incident sunlight.

14. The method of claim 13, wherein said solar cell photovoltaic substrate material is combined with said at least one means for filtering sunlight.

15. The method of claim 13, wherein said at least one means for filtering sunlight reduces the amount of sunlight which does not correspond to said at least one harmonic and said at least one heterodyne.

16. The method of claim 15, wherein said solar cell photovoltaic substrate material is combined with said at least one means for filtering sunlight.

17. A method for determining desirable energies corresponding to at least one primary band gap in a solar cell photovoltaic substrate material to be incident on a said solar cell photovoltaic substrate material comprising:
    determining at least one primary band gap width present in a said solar cell photovoltaic substrate material;
    determining at least one primary frequency of light from about 300 nanometers to about 1400 nanometers corresponding in energy to said at least one primary band gap width;
    determining at least one harmonic and at least one heterodyne of said at least one primary frequency of light from about 300 nanometers to about 1400 nanometers; and
    providing at least one means for modifying sunlight positioned between said solar cell photovoltaic substrate material and incident sunlight, whereby said at least one means permits limited energies of sunlight from about 300 nanometers to about 1400 nanometers corresponding approximately only to said at least one primary frequency, said at least one harmonic and said at least one heterodyne to pass therethrough, so as to reduce negative interactions with said solar cell photovoltaic substrate material relative to unfiltered incident sunlight.

18. The method of claim 17, wherein all desirable harmonics and all desirable heterodynes of said at least one primary frequency of light are determined.

19. A device for producing the flow of electrons due to solar energy being incident thereon comprising:
   at least one solar cell photovoltaic substrate material having at least one primary band gap; and
   at least one means for modifying sunlight, said at least one means being positioned between said at least one solar cell photovoltaic substrate material and incident sunlight, whereby said at least one means permits limited energies of sunlight from about 300 nanometers to about 1400 nanometers corresponding approximately only to at least one primary frequency, at least one harmonic and at least one heterodyne to pass therethrough, so as to reduce negative interactions within said solar cell photovoltaic substrate material relative to unfiltered incident sunlight.

20. The device of claim 19, wherein said at least one primary frequency corresponds to a plurality of primary frequencies of light, said at least one harmonic corresponds to a plurality of harmonics and said at least one heterodyne corresponds to a plurality of heterodynes.

21. The device of claim 19, wherein said at least one solar cell photovoltaic substrate material comprises at least one semiconductor material.

22. The device of claim 21, wherein said at least one semiconductor material comprises at least one material selected from the group consisting of amorphous silicon, crystalline silicon and cadmium sulfide.

23. The device of claim 19, wherein said at least one means for modifying sunlight minimizes the amount of destructively interfering wavelengths of sunlight incident on said photovoltaic substrate material.

24. The device of claim 19, wherein said at least one primary frequency corresponds to a plurality of primary frequencies of light, said at least one harmonic corresponds to a plurality of harmonics and said at least one heterodyne corresponds to a plurality of heterodynes.

25. The device of claim 24, wherein said plurality of primary frequencies correspond to those frequencies which are distributed symmetrically about a primary frequency which corresponds to said at least one primary band gap width, said plurality of primary frequencies including all of those frequencies which correspond up to at least about one-half of the maximum amplitude associated with said primary frequency.

26. The device of claim 24, wherein said plurality of harmonics correspond to those frequencies which are distributed symmetrically about each harmonic frequency and which comprise those frequencies which correspond up to at least about one-half of the maximum amplitude associated with each said harmonic frequency.

27. The device of claim 24, wherein said plurality of heterodynes correspond to those frequencies which are distributed symmetrically about each heterodyne frequency and which comprise those frequencies which correspond up to at least about one-half of the maximum amplitude associated with each said heterodyne frequency.

28. The device of claim 19, wherein said at least one means for modifying sunlight comprises at least one material.

29. The device of claim 19, wherein said at least one material comprises at least one cover material which covers at least a portion of at least one surface of said at least one solar cell photovoltaic substrate material.

30. The method of claim 19, wherein said at least one means for filtering sunlight reduces the amount of sunlight which does not correspond to said at least one harmonic and said at least one heterodyne.

* * * * *